United States Patent [19]

Swanson

[11] Patent Number: 5,247,210
[45] Date of Patent: Sep. 21, 1993

[54] METHOD AND CIRCUITRY FOR DECREASING THE RECOVERY TIME OF AN MOS DIFFERENTIAL VOLTAGE COMPARATOR

[75] Inventor: Eric J. Swanson, Buda, Tex.

[73] Assignee: Crystal Semiconductor, Austin, Tex.

[21] Appl. No.: 737,558

[22] Filed: Jul. 26, 1991

Related U.S. Application Data

[63] Continuation of Ser. No. 545,094, Jun. 27, 1990, abandoned, which is a continuation of Ser. No. 348,179, May 2, 1989, abandoned, which is a continuation of Ser. No. 214,853, Jun. 30, 1988, abandoned, which is a continuation of Ser. No. 930,131, Nov. 12, 1986, abandoned.

[51] Int. Cl.[5] ...................... H03K 5/24; H03K 19/017
[52] U.S. Cl. ................................... 307/355; 307/352; 307/362; 307/491; 307/497
[58] Field of Search ............... 307/352, 355, 362, 491, 307/494, 497, 501, 350

[56] References Cited

U.S. PATENT DOCUMENTS

4,150,311  4/1979  Matsuda et al. .................. 307/355
4,611,130  9/1986  Swanson .......................... 307/494

Primary Examiner—John Zazworsky
Attorney, Agent, or Firm—Gregory M. Howison

[57] ABSTRACT

Method and circuitry for decreasing the recovery time of an MOS differential voltage comparator after an input voltage overdrive. At the beginning of a comparison cycle a reverse voltage is momentarily applied between the gates and sources of the input pair of source-coupled MOS transistors of sufficient magnitude to form a charge accumulation layer in the channel region of each of the transistors. Operating the differential voltage comparator in such manner substantially decreases the time required for the transistors to recover from an imbalance in their electrical characteristics caused by the input voltage overdrive.

13 Claims, 4 Drawing Sheets

METHOD AND CIRCUITRY FOR DECREASING THE RECOVERY TIME OF AN MOS DIFFERENTIAL VOLTAGE COMPARATOR

This application is a continuation of U.S. patent application Ser. No. 545,094, filed Jun. 27, 1990, now abandoned, which is a continuation of U.S. patent application Ser. No. 348,179, filed May 2, 1989, now abandoned, which is a continuation of U.S. patent application Ser. No. 214,853, filed Jun. 30, 1988, now abandoned, which is a continuation of U.S. patent application Ser. No. 930,131, filed Nov. 12, 1986, now abandoned.

The present invention generally relates to electronic systems and, more particularly, is concerned with a method and circuitry for improving the speed of operation and resolution accuracy of an MOS differential voltage comparator.

BACKGROUND OF THE INVENTION

In certain applications, it is desirable that a differential voltage comparator be capable of accurately responding to a wide range of differential input voltages, including differential voltages that may vary from tens of microvolts to several volts, while operating at a high sampling frequency. Further, in view of the favorable economics of MOS integrated circuits, it is desirable that such circuit performance be achievable with circuitry that can readily be fabricated with such technology.

Figure 1A:
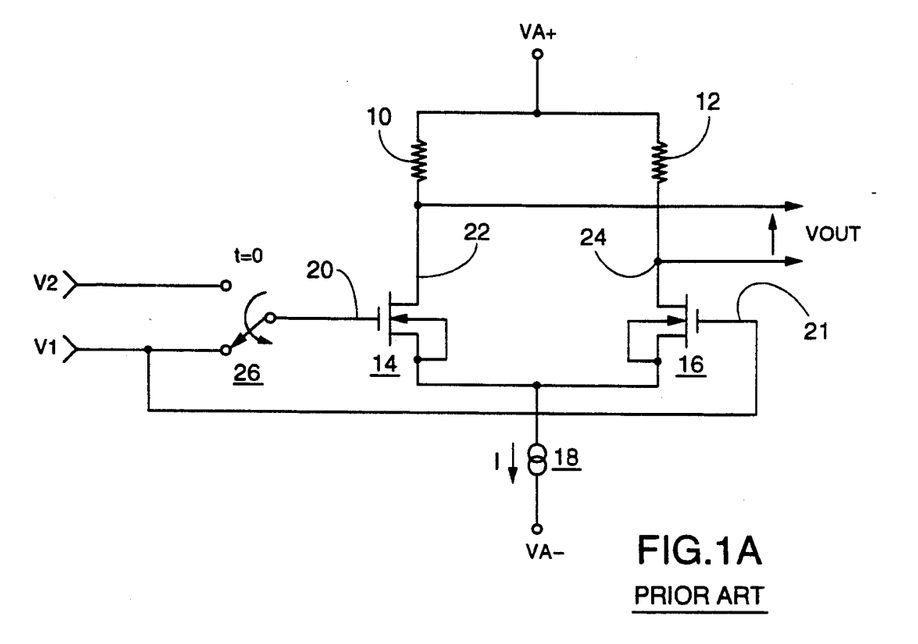
FIG. 1A is an electrical schematic diagram illustrating the front-end stage of a conventional differential voltage comparator of the prior art, together with a switch for simulating operation of the comparator.

A problem in achieving such performance with prior art circuitry is described with reference to FIG. 1A. As illustrated in FIG. 1A, a conventional differential voltage comparator comprises resistive load elements 10 and 12 respectively coupled to the drains 22 and 24 of N-channel enhancement-mode MOS transistors 14 and 16. A common current biasing element 18 is coupled to the sources of the MOS transistors 14 and 16 and provides a constant current I to the two transistors. The gate 20 of the MOS transistor 14 comprises a first input to the differential voltage comparator, and the gate 21 of the MOS transistor 16 comprises a second input to the differential voltage comparator. If the values of the resistive load elements 10 and 12 are equal, and the MOS transistors 14 and 16 have perfectly matched electrical characteristics, and the same voltage is applied to the gate 20 as to the gate 21, the differential output voltage VOUT, which is the differential voltage between the drain 22 and the drain 24, will be equal to 0 volts. But when the first input voltage on the gate 20 is greater than the second input voltage on the gate 21, the MOS transistor 14 will be more conductive than the MOS transistor 16, thereby causing a greater portion of the current I to flow through the MOS transistor 14 and its associated resistive load element 10 than through the MOS transistor 16 and its associated resistive load element 12. Consequently, the voltage at the drain 22 will be negative with respect to that of the drain 24. Conversely, when the first input voltage on the gate 20 is less than the second input voltage on the gate 21, the differential output voltage VOUT will be positive.

Certain applications of the differential voltage comparator, such as high-precision (16 bit, for example) analog-to-digital converters, may require a voltage comparison be made of voltages that differ by less than 100 microvolts shortly after a previous voltage comparison of voltages that differ by several volts. It has been observed, however, that a large voltage differential applied to the gates of the source-coupled MOS transistors (such voltage differential being referred to as an overdrive condition) causes the electrical characteristics of the MOS transistors to temporarily become mismatched. More particularly, it is observed that the transistor receiving the greater gate-to-source voltage, and thus conducting the greater amount of channel current, has its threshold voltage temporarily increased. Consequently, if an overdrive condition is followed by a condition wherein the two input voltages are nearly equal, the differential output voltage VOUT will not quickly transition to its final value; but, instead, an unduly long recovery time is observed.

Figure 1B:
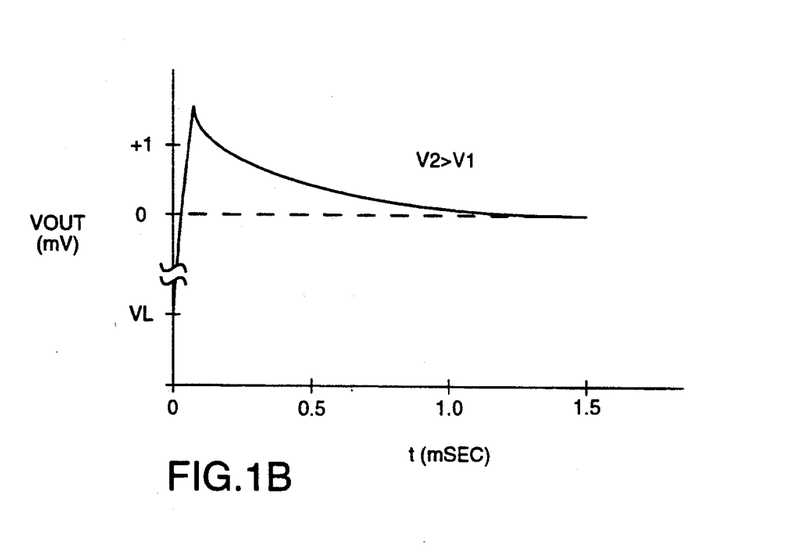
FIG. 1B is a timing diagram corresponding to operation of the differential voltage comparator of FIG. 1A for a mode of operation wherein the voltage V2 is greater than the voltage V1.

As illustrated in FIG. 1A, the condition just described is simulated with the use of a switch 26. A voltage V2 is applied to one terminal of the switch 26 and a voltage V1 is applied to the other terminal of the switch 26. The voltage V1 is also coupled to the gate 21 of the MOS transistor 16. With the positive power supply voltage VA+ equal to +5.0 volts, the negative power supply voltage VA− equal to −5.0 volts, V1 equal to 0 volts, and V2 equal to +2.0 volts, the problem described above is illustrated by the waveform of FIG. 1B. Prior to time t=0, the switch 26 is set so as to apply the voltage V2 to the gate 20 of the MOS transistor 14, thereby causing that transistor to be more conductive than the MOS transistor 16. For typical transistor characteristics, bias current I, and load resistances (which may be 4,000 ohms, for example), the differential output voltage may be at a negative value of several volts, shown in FIG. 1B as a voltage VL. At time t=0 the common terminal of the switch 26 switches to make a connection with the voltage V1, thereby causing the differential input voltage to become 0 volts. As illustrated in FIG. 1B, the differential output voltage VOUT does not immediately settle at 0 volts; but, instead, goes to a positive voltage which may be greater than 1 millivolt. Subsequently, though, the differential output voltage gradually settles to 0 volts. (Actual devices are, of course, never perfectly matched; accordingly, the differential output voltage in a non-ideal circuit gradually settles to a small, but repeatable, DC offset voltage.)

It is observed experimentally that the recovery time is dependant upon both the duration of the overdrive condition (which may be referred to as "soak time") and the magnitude of the overdrive. Consequently, the rate at which the differential voltage comparator can accurately make successive comparisons—assuming that it may be necessary to make a very sensitive comparison immediately following an overdrive—is limited by the worst case recovery time of the differential voltage comparator. As described in more detail below in the Description of a Preferred Embodiment, this recovery time problem is not a circuit RC time constant problem, but, instead, arises from a temporary imbalance in the electrical characteristics of the source-coupled MOS transistors caused by operating the MOS transistors at different current levels during the overdrive condition.

Figure 1C:
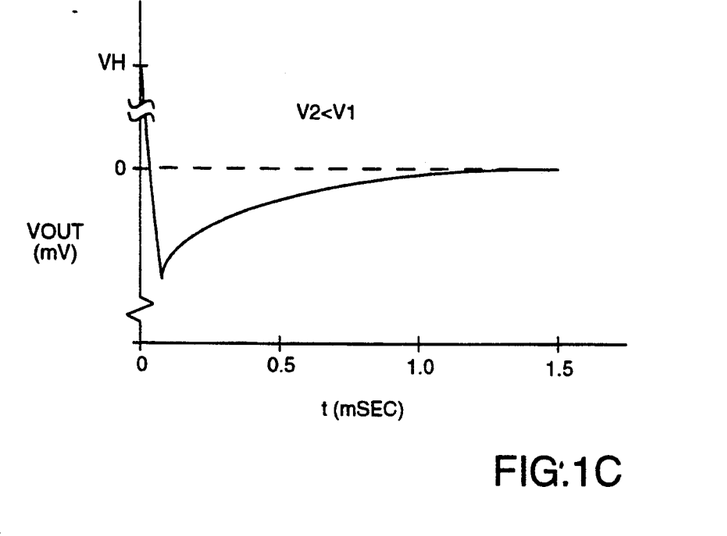
FIG. 1C is a timing diagram corresponding to operation of the differential voltage comparator of FIG. 1A for a mode of operation wherein the voltage V2 is less than the voltage V1.

FIG. 1C illustrates operation of the circuit of FIG. 1A for the circumstance where the voltage V2 is less than that of V1; for example, V1 may be at 0 volts and V2 at −2.0 volts. As expected, due to symmetry of the differential voltage comparator, the differential output voltage waveform after the switch 26 is changed from the voltage V2 to the voltage V1 is similar to that of FIG. 1B, but with opposite voltage polarities.

In accordance with the foregoing, a need exists for a method and circuitry for decreasing the recovery time of an MOS differential voltage comparator. This need is particularly acute in electronic systems such as high-precision analog-to-digital converters requiring comparison rates of 1 kHz or higher.

SUMMARY OF THE INVENTION

The present invention provides a method and circuitry for decreasing the recovery time of an MOS differential voltage comparator.

A differential voltage comparator wherein the differential input voltage is applied to the gate electrodes of a pair of source-coupled MOS transistors is operated by applying at the beginning of a comparison cycle a voltage to the sources of the source-coupled MOS transistors of sufficient polarity and magnitude to form a charge accumulation layer at the surface of the channel region of each of the source-coupled MOS transistors. Such bias condition is maintained for a brief period of time; the sources of the source-coupled MOS transistors are then connected to a conventional current biasing element before the output of the differential voltage comparator is sampled. Operating the differential voltage comparator in such a manner advantageously decreases the time required for the differential voltage comparator to recover from a temporary imbalance in the electrical characteristics of the source-coupled MOS transistors caused by a voltage overdrive from a preceding comparison cycle.

In accordance with another aspect of the invention, in order to more consistently control the magnitude of voltage that causes an accumulation layer to form at the surface of the channel region of each of the source-coupled MOS transistors, a known reference voltage may be applied to the gate electrodes of the pair of source-coupled MOS transistors at the same time that the momentary voltage is applied to the sources of the source-coupled MOS transistors The aforementioned and other features, characteristics, advantages, and the invention in general, will be better understood from the following detailed description of an illustrative embodiment when taken in conjunction with the accompanying drawings.

BRIEF DESCRIPTION OF THE DRAWINGS

FIG. 2A is an electrical schematic diagram of a differential voltage comparator suitable for operation in accordance with the present invention.

FIG. 2A-1 illustrates a detailed schematic diagram of a switch utilized in the circuit of FIG. 2A.

DETAILED DESCRIPTION OF A PREFERRED EMBODIMENT

As described above in the Background of the Invention in conjunction with FIG. 1A and FIG. 1B, the conventional differential voltage comparator of FIG. 1A has a longer than desired recovery time following a condition of overdrive on the inputs. The physical mechanism causing the slow recovery is believed to relate to electron traps existing at or near the silicon-to-silicon dioxide interface at the surface of the channel region of the N-channel MOS transistor. In the circumstance of the voltage V2 being greater than the voltage V1 prior to time $t=0$, the number of mobile electrons in the channel region of the MOS transistor 14 is greater than those in the channel region of the MOS transistor 16. It is theorized that this greater number of electrons gives rise to a greater number of electron trap states being filled in the MOS transistor 14 by comparison to the number of trap states filled in the MOS transistor 16. The number of filled trap states is also a function of the soak time. When, at $t=0$, the voltage applied to the gate 20 of the MOS transistor 14 is made equal to the voltage on the gate 21 of the MOS transistor 16, the differential output voltage VOUT would quickly go to 0 volts if the electrical characteristics of the two source-coupled MOS transistors were perfectly matched. The circuit, however, is observed to function in a manner consistent with the threshold voltage temporarily being increased on the transistor which was conducting the higher current. It is believed that the duration of this temporarily increased threshold voltage results from the relaxation time (a millisecond or more in some cases) required to change the number of trapped electrons to a new equilibrium value that will be consistent at a lower current level with the reduced number of mobile electrons in the channel.

For a source-coupled pair sharing a common current biasing element, the change to a new equilibrium is not just that of the transistor which received the overdrive, but also involves a change to a new equilibrium of the other transistor as well. This other transistor is affected because the current in one transistor is proportionately reduced as the current in the other transistor is increased.

Figures 2A, 2A:
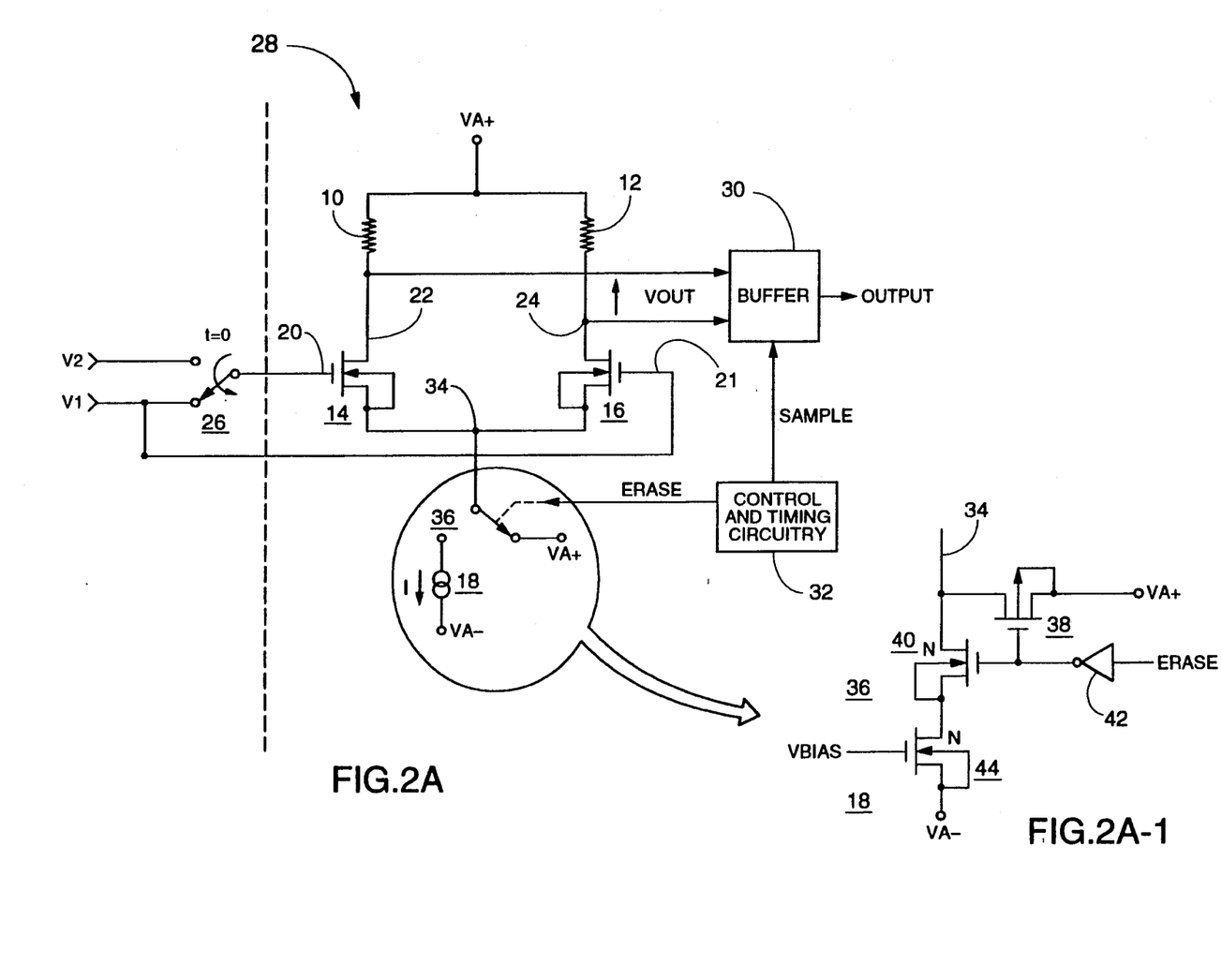

Referring now to FIG. 2A, to the right of the vertical dashed line and indicated generally by the reference numeral 28 there is illustrated a differential voltage comparator suitable for operation in accordance with the present invention. Elements, nodes, and signals that correspond with those as illustrated and described in the Background of the Invention in conjunction with FIG. 1A are repeated in FIG. 2A. The drain 22 and the drain 24 are coupled to a double-ended-input to single-ended-output buffer 30 which provides a digital signal OUTPUT that is indicative of whether the voltage V2 is greater than or less than the voltage V1. The buffer 30 is a latching buffer and is strobed at a desired time by the signal SAMPLE which is generated by control and timing circuitry 32.

The sources and P-well substrates of the MOS transistors 14 and 16 are coupled to a node 34 which, in turn, is coupled to the common terminal of a two-position switch 36. One position of the switch 36 couples the node 34 to the common current biasing element 18 which returns to the negative power supply voltage VA−. The other position of the switch 36 couples the node 34 to the positive power supply voltage VA+. In typical operation, the power supply voltage VA+ is at +5.0 volts and the negative power supply voltage VA− is at −5.0 volts.

The switch 36 is controlled by a signal ERASE which is generated by the control and timing circuitry 32. An MOS implementation of the switch 36 and the common current biasing element 18 is illustrated in FIG. 2A-1. The switch 36 may conveniently be comprised of a P-channel enhancement-mode transistor 38, an N-channel enhancement-mode transistor 40, and an inverter 42. When the signal ERASE is high, the transistor 38 is turned on and the transistor 40 is turned off; when the signal ERASE is low, the transistor 38 is turned off and the transistor 40 is turned on. The common current biasing element 18 comprises an N-channel enhancement-mode transistor 44 which has its source and substrate connected to the negative power supply voltage VA− and its gate electrode connected to a bias voltage VBIAS which is more positive than the negative power supply voltage VA− by an amount greater than the magnitude of one N-channel threshold voltage.

Figure 2B:
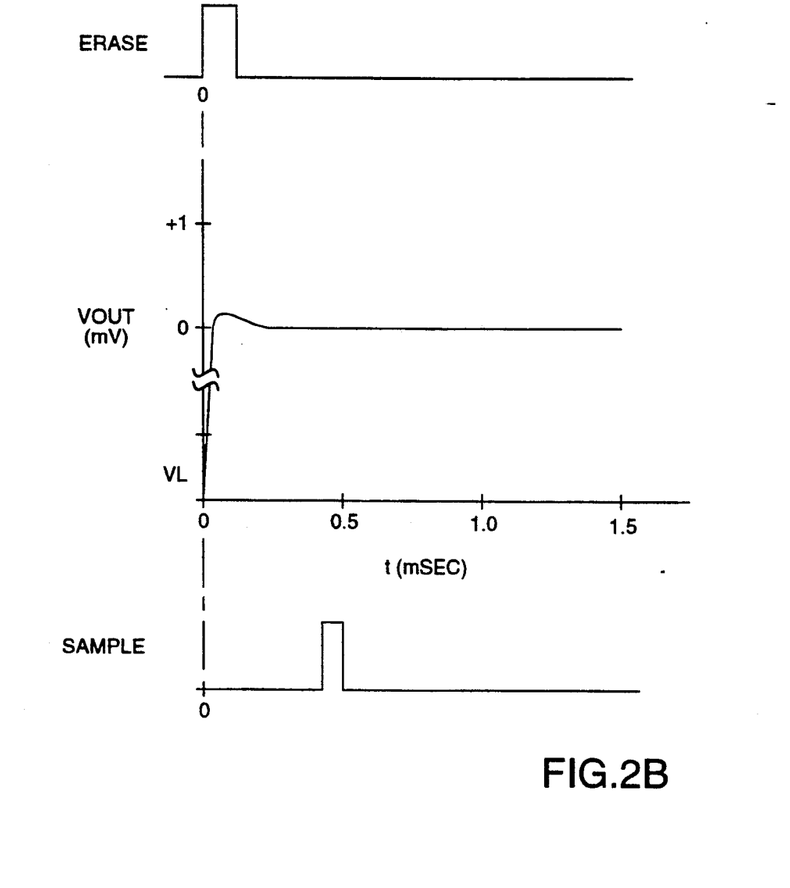
FIG. 2B is a timing diagram corresponding to operation of the differential voltage comparator of FIG. 2A in accordance with the present invention.

Operation of the differential voltage comparator of FIG. 2A is next described in conjunction with the timing diagrams of FIG. 2B. For the illustrative example of operation illustrated in FIG. 2B, it is assumed that the voltage V1 is at a voltage intermediate to VA+ and VA−, and that the voltage V2 is at a voltage substantially more positive than that of the voltage V1. It is further assumed, though, that the voltage V2 is at least one N-channel threshold voltage more negative than the positive power supply voltage VA+. The purpose of maintaining a minimum difference between the power supply voltage VA+ and the analog input voltage is to insure in the below-described method of operating the comparator that there will be available a reverse bias voltage between the gates and sources of the MOS transistors 14 and 16 sufficient to form an accumulation layer of electrons in the channel regions of the transistors. In a typical embodiment, the N-channel threshold voltage is typically 0.7 volts. In many applications the minimum difference between the power supply voltage VA+ and an allowable analog input voltage will be considerably greater than one N-channel threshold voltage; for example, it is a common practice to limit the analog input voltage range to between −3.0 volts and +3.0 volts. For such a range, the minimum difference between the power supply voltage VA+ and the analog input voltage would be approximately 2.0 volts.

Prior to t=0, the switch 26 is positioned to cause a positive voltage overdrive between the gate 20 and the gate 21. The time prior to t=0 corresponds to that of a previous comparison cycle. A new comparison cycle is commenced when a new differential input voltage is applied to the gates 20 and 21. The case of going from a comparison cycle having a large voltage overdrive to a comparison cycle having a small differential voltage is simulated by connecting the gate 20 to the voltage V1 at t=0. The signal ERASE also goes high at the beginning of the comparison cycle, causing the node 34 to be coupled to the positive power supply voltage VA+. The signal ERASE can alternatively be taken high prior to t=0 or shortly thereafter, the time at which the signal ERASE goes high not being critical. The positive power supply voltage VA+ is applied to the node 34 for a short time (250 nanoseconds, for example),after which the node 34 is reconnected to the common current biasing element 18 . The pulse width of the signal ERASE is not critical; the signal ERASE may be kept high as long as desired, and experimental testing has verified proper operation with pulse widths as small as 100 nanoseconds. Furthermore, even narrower pulse widths may be adequate.

As illustrated in FIG. 2B, the foregoing method of operating the differential voltage comparator significantly reduces the recovery time of the differential output voltage VOUT. The small voltage overshoot which remains is believed to be due to coupling effects and not due to the previously-described charge trapping mechanism.

As further illustrated in FIG. 2B, the differential output voltage can be stobed into the buffer 30 by the signal SAMPLE from the control and timing circuitry 32 at a much earlier time than is possible with the conventional differential voltage comparator of FIG. 1A.

An introductory discussion of MOS device theory may be helpful for an understanding of the operation of the illustrative embodiment of the present invention and for an understanding of alternative embodiments thereof. The channel region of an MOS transistor is the region of the transistor's substrate between the source and drain regions of the device and located near the surface of the substrate. The gate electrode lies over the channel region but is separated therefrom by a thin dielectric material typically made of silicon dioxide, though other dielectric materials can be used. The gate electrode may be fabricated of a metal such as aluminum or of a conductive material such as doped polycrystalline silicon. For an N-channel transistor, the drain and source regions are comprised of an N-type semiconductor material which has been diffused or implanted into a P-type semiconductor substrate. In integrated circuits, the P-type substrate typically comprises a P-well disposed in a larger N-type substrate.

The channel region of the MOS transistor may be characterized by its operation in one of three charge distribution conditions: a charge accumulation condition, a charge depletion condition, or a charge inversion condition.

For an N-channel enhancement-mode MOS transistor, applying a negative voltage to the gate electrode with respect to the P-type substrate causes additional P-type carriers, called holes, to be attracted to the surface of the channel region at the silicon-to-silicon dioxide interface. Such a bias thus causes an accumulation of majority carriers near the surface of the substrate; and, accordingly, this accumulation of majority carriers is referred to as comprising a charge accumulation layer.

Measurement of the gate to substrate capacitance when a strong accumulation layer is present gives a value of capacitance that is approximately equal to that of two parallel plates separated by the gate dielectric; such a capacitance value is the maximum gate to substrate capacitance.

If a small positive voltage having a value less than that of the threshold voltage is applied to the gate, a negative charge will be induced in the semiconductor substrate due to holes being repelled from the vicinity of the silicon-to-silicon dioxide interface. This repelling of majority carriers leaves behind a negatively charged depletion region consisting of uncompensated acceptor atoms. The depletion region gets larger as the gate to substrate voltage increases. For such positive voltage bias conditions, the device is said to be operating in the depletion region. In this region a plot of gate capacitance as a function of bias voltage shows that the gate capacitance decreases with increasing voltage. Such operation is analogous to the plates of a capacitor being moved farther apart.

When the gate voltage reaches a value equal to the threshold voltage of the transistor, though, the depletion region does not get any larger; instead, minority carriers (electrons for an N-channel device) begin to form a negative charge layer, called an inversion layer, in the channel region near the surface of the semiconductor substrate. It is these charges that support a channel current from drain to source. As the gate voltage continues to increase, more electrons are induced into the inversion layer, resulting in increased drain-to-source current. When the inversion layer first begins to form, the gate to substrate capacitance begins increasing and continues to increase with increasing gate voltage until a strong inversion layer is formed, at which point the gate capacitance again is at its maximum.

The onset of channel conductance provides a reasonably definitive boundary between the inversion and depletion regions. The boundary between the depletion and accumulation regions, though, is more difficult to accurately define. Nevertheless, if the gate to substrate capacitance is at least 9/10 of its maximum value (and the gate voltage is less than that of the threshold voltage), one can be confident that a reasonably strong accumulation layer has been formed.

Referring again to FIGS. 2A and 2B, it should be appreciated that the momentary application of the positive power supply voltage VA+ to the node 34 for the assumed operation voltages causes a charge accumulation layer to form at the surface of the channel region of each of the MOS transistors 14 and 16. For the assumed voltages, each of the gates 20 and 21 is at least two volts more negative than the voltage applied to the sources and substrates of each of the MOS transistors 14 and 16. It is theorized that flooding the channel region with holes is effective for quickly eliminating excess trapped negative charge near the silicon-to-silicon dioxide interface, thereby causing the threshold voltages of the two source-coupled MOS transistors to more quickly become restored to a matched condition.

Figure 3:
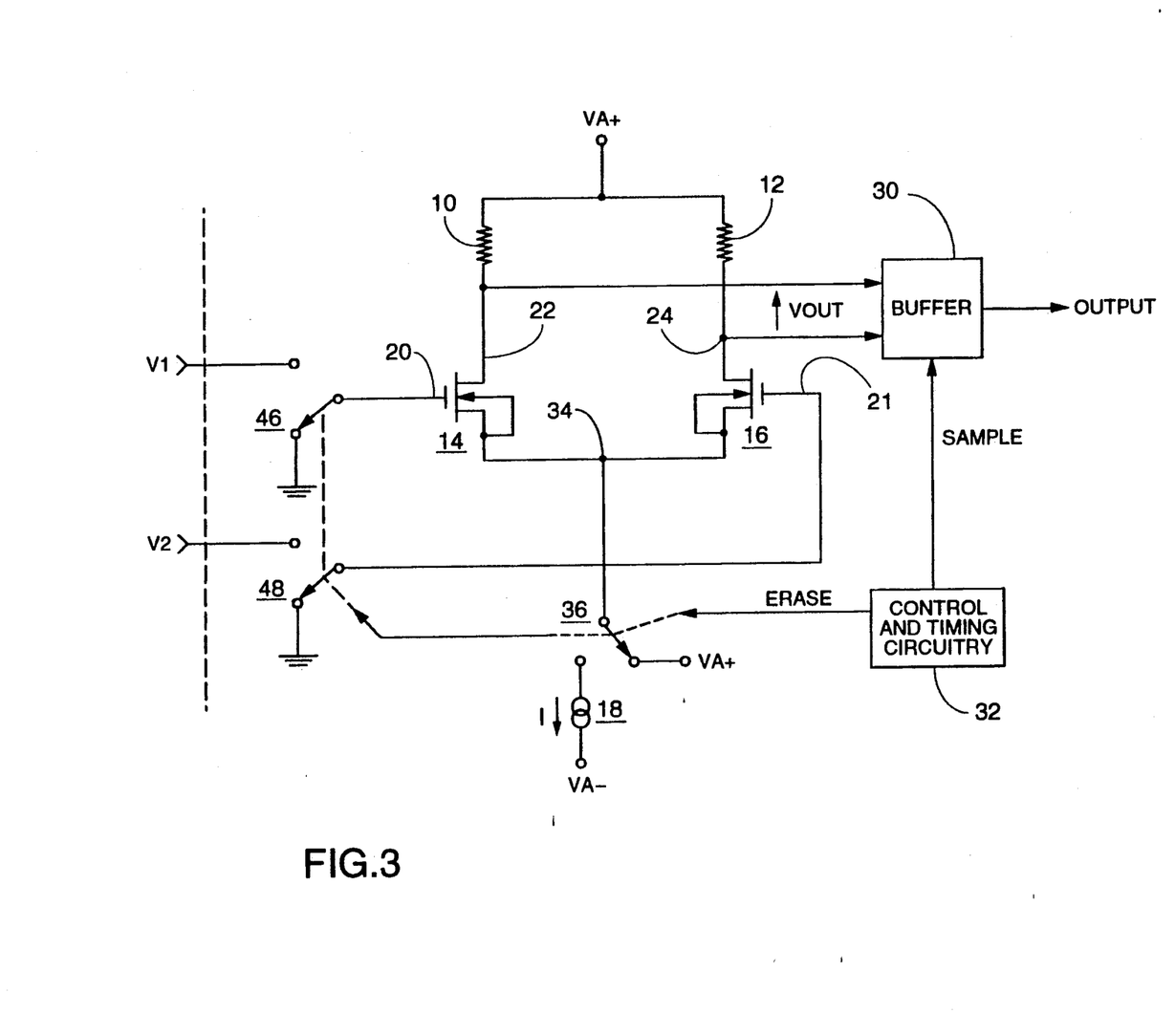
FIG. 3 is an electrical schematic diagram illustrating an alternative embodiment of circuitry suitable for operation in accordance with another aspect of the present invention.

Referring now to FIG. 3, an alternative embodiment of circuitry suitable for operation in accordance with the above-described method is illustrated. The differential voltage comparator of FIG. 3 is identical to that of FIG. 2A with the exception of the addition of a switch 46 and a switch 48. When the signal ERASE is high, the switches 46 and 48 couple the gates 20 and 21 to a known reference voltage, ground in this case, that is substantially more negative than the positive power supply voltage VA+. When the signal ERASE goes low, the gate 20 is coupled through the switch 46 to one input of the differential amplifier, designated as VIN1, while the gate 21 is coupled through the switch 48 to the other input of the differential amplifier, designated as VIN2. By applying a known constant reference voltage to the gates of the MOS transistors 14 and 16, a consistent accumulation layer formation is achieved for each comparison cycle.

Although a preferred embodiment of the present invention has been described, it should be apparent to persons of ordinary skill in the art that various changes may be made in the method and circuitry described without departing from the spirit and scope of the invention. For example, it should be apparent that the load elements coupled to the drains of the source-coupled MOS transistors need not be merely resistors; active loads, for example, may be used. Accordingly, as used herein, the term load element is intended to include load circuitry that comprises not only a single electrical component, but which may comprise a plurality of components. Moreover, it is not necessary that the differential output voltage from the drains of the source-coupled MOS transistors be utilized; alternatively, a single-ended output from either of the drains can be used.

For another change that may be made in the method and circuitry described, it is not necessary that the source-coupled MOS transistors 14 and 16 be enhancement-mode devices; depletion-mode devices will operate in the same manner. In order to form a charge accumulation layer at the surface of the channel region of each of the source-coupled MOS transistors, though, a larger reverse bias would typically be required for depletion-mode devices than is required for enhancement-mode devices. Additionally, the method and circuitry may be implemented with P-channel MOS transistors rather than with N-channel MOS transistors. In the case of P-channel transistors, it is, of course, necessary to reverse all voltage polarities. In the case of a P-channel MOS transistor implementation, the accumulation layer that must be formed is one of electrons rather than of holes.

What is claimed is:

1. A method for operating a differential voltage comparator having an input voltage range that is greater than 100 microvolts, the differential inputs of the differential voltage comparator comprising the gate electrodes of a pair of source-coupled MOS transistors with the drains of the source-coupled MOS transistors connected to a positive supply voltage through respective loads and the differential inputs operable to have a measurable differential voltage of less than 100 microvolts impressed thereon, the method comprising:

connecting the gate of one of the source-coupled MOS transistors to a first input voltage signal during at least a first portion of a comparison cycle subsequent to a precharge portion of the comparison cycle such that a measurable differential voltage of less than 100 microvolts is impressed across the differential inputs;

precharging the sources and substrates of the source-coupled MOS transistors to a precharge voltage of sufficient magnitude and polarity with respect to the voltages applied to the gates of the source-coupled MOS transistors to form a charge accumulation layer at the surface of the channel region of each of the source-coupled MOS transistors during the precharge portion of the comparison cycle comprising a short duration of time proximate to the beginning of the comparison cycle;

coupling the sources of the source-coupled MOS transistors to a common current biasing element to sink current to a negative supply voltage after the step of precharging occurs; and sampling the output of the differential voltage comparator after the coupling step and during the comparison cycle and operable with an input differential voltage of less than 100 microvolts.

2. The method of claim 1 and further comprising applying a fixed voltage to the gate of the other of the source-coupled MOS transistors at times occurring prior to the beginning of a comparison cycle and when the input voltage signal is not applied thereto.

3. The method of claim 1 wherein the step of precharging for a short duration of time terminates after the beginning of the comparison cycle.

4. The method of claim 1 wherein the MOS source-coupled transistors are N-channel transistors and the step of precharging the sources and substrates of the source-coupled MOS transistors comprises connecting the sources and substrates of the source-coupled MOS transistors to the precharge voltage, the precharge voltage having a voltage level more positive by at least one N-channel threshold voltage than the maximum input voltage signal that can be applied during the precharge portion of the comparison cycle.

5. The method of claim 1 and further comprising applying a second input voltage signal to the gate of the other of the source-coupled MOS transistors during at least the first portion of the comparison cycle subsequent to the precharge portion of the comparison cycle.

6. A method for operating a differential voltage comparator having an input voltage range that is greater than 100 microvolts, the differential inputs of the differential comparator comprising the gate electrodes of a pair of source-coupled MOS transistors each having the drains thereof connected through respective loads to a positive supply voltage, the method comprising:
 connecting the gate of one of the source-coupled MOS transistors to a first direct coupled input voltage signal such that the gate of the one source-coupled MOS transistor does not float at substantially any time;
 connecting the gate of the other of the MOS source-coupled transistors to a second direct coupled input voltage signal such that the gate of the one source-coupled MOS transistor does not float at substantially any time, the voltage difference between the first and second direct coupled input voltage signals comprising a differential input voltage signal having a magnitude of less than 100 microvolts;
 precharging the sources and substrates of the source-coupled MOS transistors to a precharge voltage of sufficient magnitude and polarity with respect to the voltages applied to the gates of the source-coupled MOS transistors to form a charge accumulation layer at the surface of the channel region of each of the source-coupled MOS transistors for a short duration of time proximate to the beginning of a comparison cycle;
 coupling the sources of the source-coupled MOS transistors to a common current biasing element to sink current to a negative supply voltage after the step of precharging is completed; and
 sampling the output of the differential voltage comparator during the comparison cycle and after the step of coupling and operable with an input differential voltage of less than 100 microvolts.

7. The method of claim 6 wherein the precharging step during the short duration of time terminates after the initiation of the comparison cycle.

8. The method of claim 6 wherein the source-coupled MOS transistors are N-channel devices and the step of precharging comprises the step of raising the voltage of the sources and substrates of the source-coupled MOS transistors to the precharge voltage which comprises a positive supply voltage more positive by at least one N-channel threshold voltage then the operating voltage range on the gates of the source-coupled MOS transistors.

9. A method for operating a differential voltage comparator having an input differential voltage range of substantially greater than 100 microvolts, the differential inputs of the differential voltage comparator comprising the gate electrodes of a pair of source-coupled MOS transistors having the drains thereof connected through respective loads to a positive supply voltage, a first input provided by the gate electrode of one of the source-coupled MOS transistors and a second input provided by the gate of the other of the source-coupled MOS transistors, comprising:
 impressing a first differential voltage signal across the first and second inputs during a first comparison cycle and having a magnitude substantially greater than 100 microvolts, the voltage on each of the first and second inputs having a finite voltage thereon at all other times;
 impressing a second finite differential voltage signal across the first and second inputs during a second comparison cycle subsequent to the first comparison cycle and having a value less than 100 microvolts;
 precharging the sources and substrates of the source-coupled MOS transistors to a precharge voltage of sufficient magnitude and polarity with respect to the voltages applied to the gates of the source-coupled MOS transistors to form a charge accumulation layer at the surface of the channel region of each of the source-coupled MOS transistors for a short duration of time proximate to the beginning of each of the first and second comparison cycles;
 coupling the sources of the source-coupled MOS transistors to a common current biasing element to sink current to a negative supply voltage after the step of precharging; and
 sampling the output of the differential voltage comparator after the sources are coupled to the common current biasing element during each of the first and second comparison cycles and operable with the differential voltage across the first and second inputs for both the first and second comparison cycles.

10. The method of claim 9 wherein one of the first and second inputs is connected to a predetermined fixed reference voltage for the entire duration of each of the first and second comparison cycles.

11. The method of claim 9 wherein the source-coupled MOS transistors are N-channel transistors and the step of precharging comprises precharging the sources and substrates of the source-coupled MOS transistors to the precharge voltage which has a magnitude more positive by at least one N-channel threshold voltage than the maximum operating voltage on either the first or second inputs.

12. A method for operating a differential voltage comparator, the differential inputs of the differential voltage comparator comprising the gate electrodes of a pair of source-coupled MOS transistors having the drains thereof connected through respective loads to a positive supply voltage, a first input provided by the gate electrode of one of the source-coupled MOS transistors and a second input provided by the gate electrode of the other of the source-coupled MOS transistors, comprising:
 impressing a first differential voltage signal across the first and second inputs during of a first comparison cycle and having a magnitude substantially greater than 100 microvolts;

impressing a second differential voltage signal across the first and second inputs during a second comparison cycle subsequent to the first comparison cycle and having a value less than 100 microvolts;

precharging the sources and substrates of the source-coupled MOS transistors to a precharge voltage of sufficient magnitude and polarity with respect to the voltages applied to the gates of the source-coupled MOS transistors to form a charge accumulation layer at the surface of the channel region of each of the source-coupled MOS transistors for a short duration of time proximate to the beginning of each of the first and second comparison cycles;

connecting the first and second inputs to a common reference voltage during the short duration of time in which the sources and substrates of the source-coupled MOS transistors are precharged in the precharging step;

coupling the sources of the source-coupled MOS transistors to a common current biasing element to sink current to a negative supply voltage after the step of rpecharging; and sampling the output of the differential voltage comparator after the sources of the source-coupled substrates are coupled to the common current biasing element during each of the first and second comparison cycles, the step of sampling operable with the differential voltage impressed across the first and second inputs during both the first and second comparison cycles.

13. A method for operating a differential voltage comparator, the differential inputs of the differential voltage comparator comprising the gate electrodes of a pair of source-coupled MOS transistors having the drains thereof connected through respective loads to a positive supply voltage, the method comprising:

connecting the gate of one of the source-coupled MOS transistors to a first input voltage signal during at least a first portion of a comparison cycle subsequent to a precharge portion of the comparison cycle;

applying an input voltage signal to the gate of the other of the source-coupled MOS transistors at least at the beginning of a comparison cycle to provide a differential voltage across the gates of the source-coupled MOS transistors of less than 100 microvolts, the gate of the other of the source-coupled MOS transistors connected to a finite voltage whenever the input voltage signal is not applied thereto;

precharging the sources and substrates of the source-coupled MOS transistors to a precharge voltage of sufficient magnitude and polarity with respect to the voltages applied to the gates of the source-coupled MOS transistors during the precharge portion of the comparison cycle comprisign a short duration of time proximate to the beginning of the comparison cycle;

coupling the sources of the source-coupled MOS transistors to a common current biasing element to sink current to a negative supply voltage after the step of precharging occurs; and sampling the output of the differential voltage comparator after the coupling step and during the comparison cycle, the step of sampling operable with a differential input voltage of less than 100 microvolts.

* * * * *